(12) United States Patent
Shenderovich

(10) Patent No.: US 6,975,553 B2
(45) Date of Patent: Dec. 13, 2005

(54) NONALIGNED ACCESS TO RANDOM ACCESS MEMORY

(75) Inventor: Georgiy Shenderovich, Petah-Tiqwa (IL)

(73) Assignee: NeoMagic Israel Ltd., Netanya (IL)

( * ) Notice: Subject to any disclaimer, the term of this patent is extended or adjusted under 35 U.S.C. 154(b) by 37 days.

(21) Appl. No.: 10/816,849

(22) Filed: Apr. 5, 2004

(65) Prior Publication Data

US 2005/0219933 A1    Oct. 6, 2005

(51) Int. Cl.[7] .............................................. G11C 8/00
(52) U.S. Cl. ....................... 365/230.03; 365/230.06; 365/231
(58) Field of Search ................ 365/230.01, 230.03, 365/230.06, 231, 238

(56) References Cited

U.S. PATENT DOCUMENTS 6,070,003 A * 5/2000 Gove et al. ................. 710/317

6,507,534 B2 * 1/2003 Balluchi ................. 365/230.06

* cited by examiner

Primary Examiner—Richard Elms
Assistant Examiner—Hien Nguyen
(74) Attorney, Agent, or Firm—Dekal Patent Ltd.; David Klein

(57) ABSTRACT

Memory apparatus including a byte-bank organized in N rows and 8 columns, having a capacity of $\log_2(N)$ bytes, a $\log_2(N)$ bit address bus operative to address the byte-bank, an address offset bus operative to generate offsets (e.g., one-bit offsets) to bits of the byte-bank with an address conversion operator, and an adder in operative communication with the address offset bus and the $\log_2(N)$ bit address bus, the adder operative to add addresses of the byte-bank with the offset generated by the address conversion operator and output a result to the $\log_2(N)$ bit address. A random access memory array may include a plurality of the byte-banks.

13 Claims, 3 Drawing Sheets

NONALIGNED ACCESS TO RANDOM ACCESS MEMORY

FIELD OF THE INVENTION

The present invention relates generally to methods and apparatus for operating memory devices, and particularly to methods and apparatus for organizing random access memories, e.g., SRAM arrays, with nonaligned access, wherein unambiguous access to the bits of the array may be obtained even if two or more column lines and two or more row lines are activated at the same time.

BACKGROUND OF THE INVENTION

Random access memories, such as static random access memories (SRAMs) or dynamic random access memories (DRAMs), generally comprise a multiplicity of addresses for writing therein data. Data in the addresses may be accessed, for example, through data latches for performing operations, e.g., programming, on a memory cell array, e.g., a non-volatile memory cell array.

Reference is now made to FIG. 1, which illustrates a typical random access memory array 10 of the prior art (the illustrated example is SRAM). The memory array 10 has 8 rows and 8 columns and has a capacity of 64 bits or 8 bytes. Each bit can be read or written by selecting it with an appropriate row line and appropriate column line simultaneously. Selection of the appropriate row and column is done by means of row and column addresses, which are the binary values of the row and column numbers in the memory array 10. In the illustrated example of FIG. 1, three bits are enough for addressing each row and an additional three bits are enough for addressing each column (each row or column address being numbered from 0 to 7, i.e., binary 000 to 111). Thus, a common 6-bit address can read or write each of 64 bits in the memory array 10.

Access to the rows may be controlled by a row decoder 12, and access to the columns may be controlled by a column decoder 14. The row and column decoders 12 and 14 may convert 3-bit row addresses and 3-bit column addresses to a single row select and a single column select signal, respectively.

It is noted that the "memory word length" refers to the memory array row length in bits. The memory array capacity is defined by the number of memory rows. Each appropriate bit in every memory array row belongs to a memory array column.

The memory array 10 may be accessed with a byte-aligned access using an 8-bit resolution. For such an access, all column lines may be activated and one of the row lines may be activated, thereby selecting all the bits in that row. Thus, a 3-bit row address is sufficient for accessing the whole byte.

The traditional, prior art organization of an SRAM is fine for such byte-aligned accesses, wherein if all the column lines are activated only one row line is activated. There is no ambiguity of two different rows that are both selected.

However, the prior art memory array structure is not capable of performing a nonaligned memory access. A "nonaligned memory access" is defined as an access wherein at least two column lines and at least two row lines are activated at the same time. An example of a nonaligned memory access is a request to read the four most significant bits of the top byte and the four least significant bits of the byte below, in a single data transaction. Such an access is impossible with the memory array 10, because it requires activating a pair of row lines and all the column lines, which creates an ambiguity in the memory array electric scheme.

SUMMARY OF THE INVENTION

The present invention seeks to provide methods and apparatus for organizing random access memories, e.g., SRAM arrays, with nonaligned access (e.g., with a byte resolution), wherein unambiguous access to the bits of the array may be obtained even if two or more column lines and two or more row lines are activated at the same time, as is described more in detail hereinbelow.

There is thus provided in accordance with an embodiment of the present invention memory apparatus including a byte-bank organized in N rows and 8 columns, having a capacity of $\log_2(N)$ bytes, a $\log_2(N)$ bit address bus operative to address the byte-bank, an address offset bus operative to generate offsets (e.g., one-bit offsets) to bits of the byte-bank with an address conversion operator, and an adder in operative communication with the address offset bus and the $\log_2(N)$ bit address bus, the adder operative to add addresses of the byte-bank with the offset generated by the address conversion operator and output a result to the $\log_2(N)$ bit address. A random access memory array may include a plurality of the byte-banks.

In accordance with an embodiment of the present invention, for each byte-bank, the address conversion operator may convert an unaligned address on a byte resolution into a $\log_2(N)$ address on a data word resolution. The address offset may include shifting the most significant byte from the least significant byte by a distance of 8 bytes.

There is also provided in accordance with an embodiment of the present invention a method including providing a random access memory array including a plurality of the byte-banks, wherein each byte-bank is organized in N rows and 8 columns, each byte-bank having a capacity of $\log_2(N)$ bytes, providing a $\log_2(N)$ bit address bus operative to address the byte-bank, generating address offsets to bits of the byte-bank with an address conversion operator, and adding addresses of the byte-bank with the generated address offset and outputting a result to the $\log_2(N)$ bit address.

The method may include performing an unaligned memory access to the byte-banks. The unaligned memory access may include transforming a data word before a memory write or read operation and compensating for the data word rotation with the offsets.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
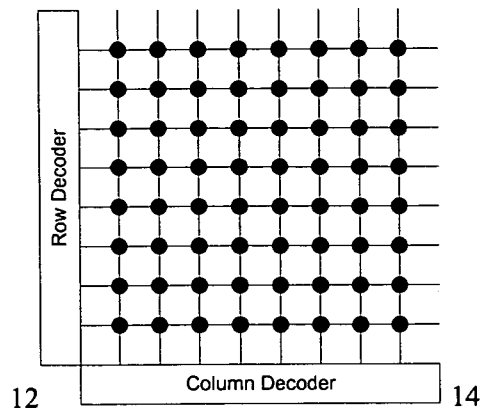
FIG. 1 is a simplified schematic illustration of a typical SRAM array of the prior art.
Figure 2:
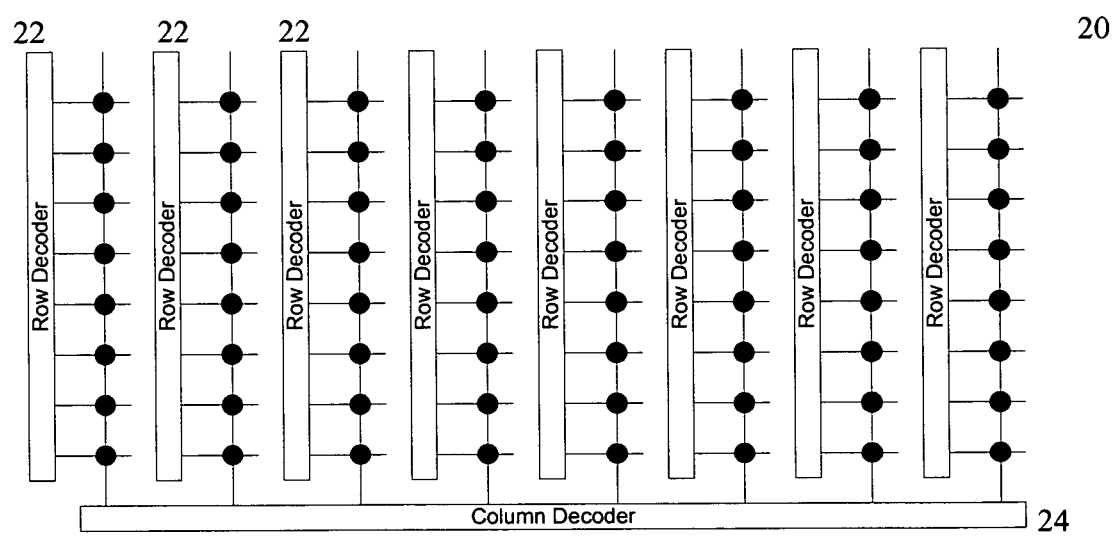
FIG. 2 is a simplified schematic illustration of a memory array, such as but not limited to, an SRAM, constructed and operative in accordance with an embodiment of the present invention, and including row decoders and a column decoder.

Reference is now made to FIG. 2, which illustrates a random access memory array 20 (such as but not limited to, SRAM). In the illustrated embodiment, memory array 20 has 8 rows and 8 columns and has a capacity of 64 bits or 8 bytes, but the invention is not limited to these values. Every row may have a dedicated row decoder 22, whereas access to the columns may be controlled by a column decoder 24. The dedicated row decoders 22 may provide a separate access to every byte within the whole data word. In other words, for every column, each and every row can be selected separately.

Figure 3:
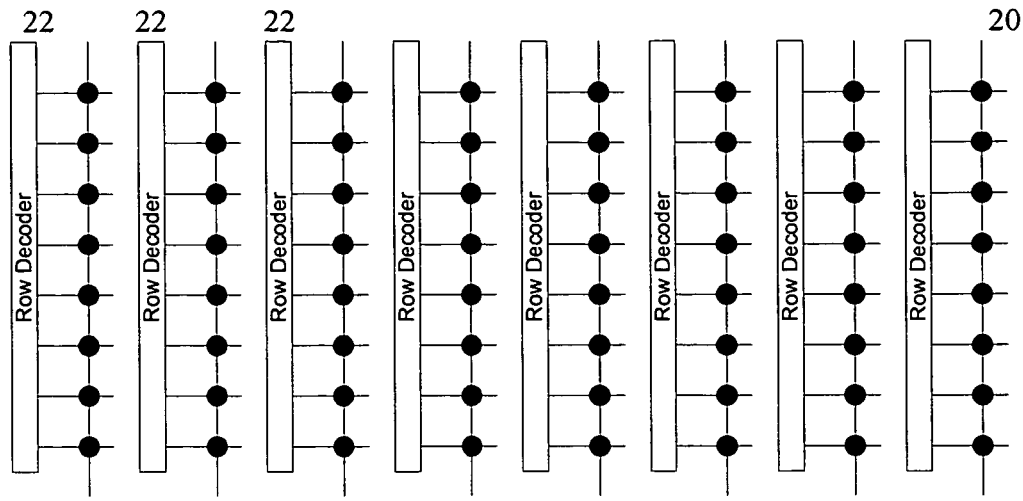
FIG. 3 is a simplified schematic illustration of the memory array of FIG. 2, with all the columns permanently selected and the column decoder omitted.

In the structure of memory array 20, for example, a whole 8-byte word may be accessed in a single data transaction. Referring to FIG. 3, memory array 20 may be constructed wherein all the columns are permanently selected, thereby eliminating the need for the column decoder 24.

Figure 4:
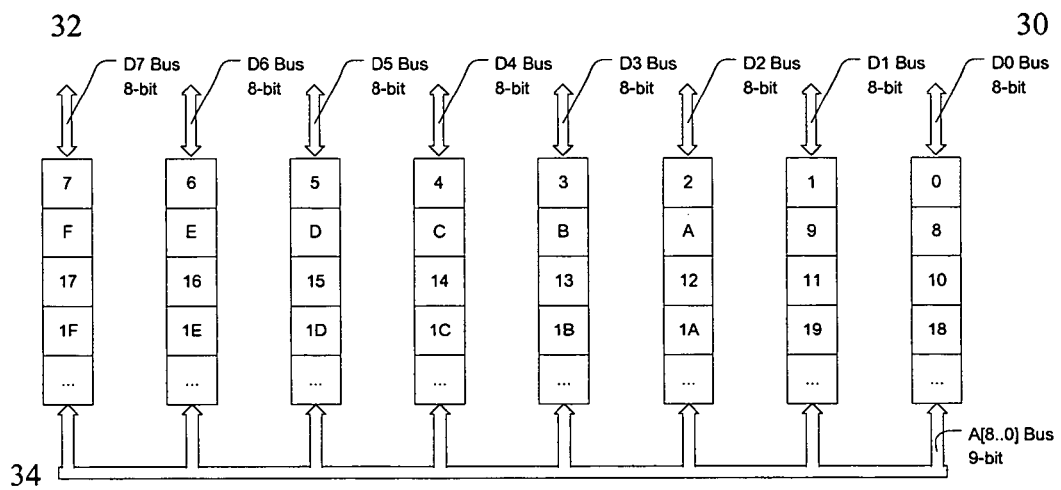
FIG. 4 is a simplified block diagram of a memory partition address distribution, such as a 2 KB 512×64-bit memory partition address distribution, in accordance with an embodiment of the present invention.

The structure of FIG. 3 may serve as a building block ("byte bank") to organize larger arrays. One non-limiting example is an array of 512 bits, organized with 8×64 memory partitioning. Another example is an array with a memory partition size of 4 KB, which may be organized with the building block arrays of FIG. 3, that is, an array of 512×64 bits. Such an example is shown in FIG. 4, which illustrates a 2 KB 512×64-bit memory partition address distribution, in accordance with an embodiment of the present invention. The SRAM memory partition of FIG. 4 is built from 8 byte-banks 30. Each byte-bank 30 has its own 8-bit data bus and row decoder 32, similar to the building block array of FIG. 3. In FIG. 4, the byte banks 30 and 8-bit data bus and row decoders 32 are numbered from 0 to 7 from the right to the left. A common 9-bit address bus 34 (9 bits, because $2^9$=512) may provide an aligned access to a 64-bit data word in every memory partition row.

Thus, in general, the random access memory array of the present invention includes byte-banks organized in N rows and 8 columns, wherein each byte bank has capacity of $\log_2(N)$ bytes and is addressed by a $\log_2(N)$ bit address bus. In the above example, N=512 and each byte bank has capacity of 9 bytes and is addressed by a 9-bit address bus ($\log_2(512)$=9).

If the memory partition distribution of FIG. 4 is used in an aligned data access, the least significant byte-bank (addresses 0, 8, etc.) may provide the least significant byte and the most significant byte-bank (addresses 7, F, etc.) may provide the most significant byte.

In accordance with an embodiment of the present invention, the memory partition distribution of FIG. 4 can also be used in an unaligned data access. In such a case, the least significant byte may be taken starting from the second byte-bank (1, 9, etc.) or the third byte-bank (2, A, etc.) and so on, whereas the most significant byte may be taken from the first byte-bank (0, 8, etc.) or the second byte-bank (1, 9, etc.) and so on, respectively. Projecting the nonaligned data format on the data bus results in the bytes within the data word being rotated (shifted) depending on the nonaligned address. This shift must be corrected when writing to or reading from memory.

For correction of the data word contents rotation (shift), two data conversion operators may be introduced.

Figure 5:
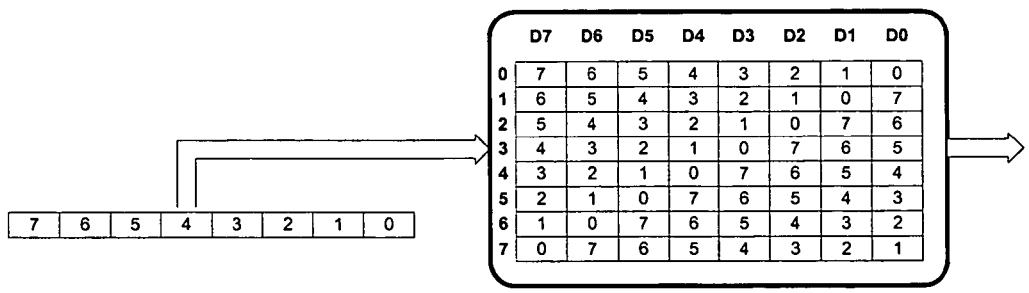
FIG. 5 is a simplified block diagram of a data conversion operator for memory write, in accordance with an embodiment of the present invention.

Reference is now made to FIG. 5, which illustrates a data conversion operator for writing to memory, in accordance with an embodiment of the present invention. The first row of the operator function is provided for aligned addressing; hence no conversion is done. The second to eight rows of the operator function relates to the nonaligned addressing on a byte resolution. For example, in the second row, the data words for the D(n) bus of the data bus and row decoder 32 are shifted to the D(n+1) bus (for n=0, 1, 2, . . . 6) and the data word for the D7 bus is shifted to the D0 bus. Similarly, in the third row, the data words for the D(n) bus are shifted to the D(n+2) bus (for n=1, 2, . . . 6), and the data words for the D6 and D7 buses are shifted to the D0 and D1 buses, respectively. The data words, rotated in accordance with the appropriate row of the operator function of FIG. 5, may then be written to the memory.

Figure 6:
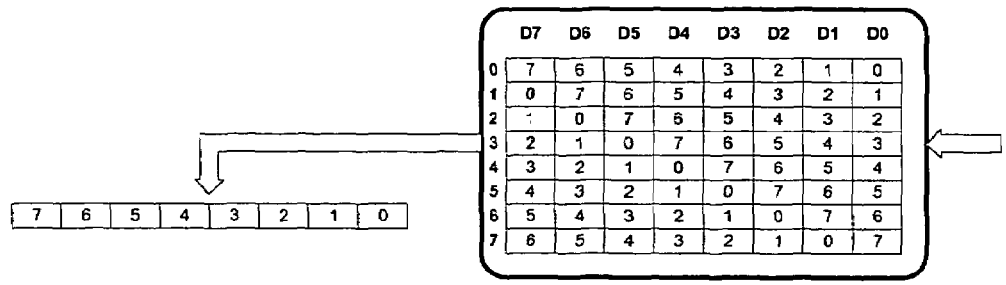
FIG. 6 is a simplified block diagram of a data conversion operator for memory read, in accordance with an embodiment of the present invention.

Reference is now made to FIG. 6, which illustrates a data conversion operator for reading from memory, in accordance with an embodiment of the present invention. The first row of the operator function is provided for aligned addressing; hence no conversion is done. The second to eight rows of the operator function relates to the nonaligned addressing on a byte resolution. For example, in the second row, the data words for the D(n) bus are shifted to the D(n−1) bus (for n=7, 6, 5, . . . 1) and the data word for the D0 bus is shifted to the D7 bus. The data word read from the memory may thus be rotated (shifted) in accordance with the appropriate row of the operator function of FIG. 6.

From the foregoing description of the data word rotation, it may be seen that if the least significant byte of the 64-bit data word is located in the byte-bank 1, 2, 3, etc., the most significant byte is then located in the bank 0, 1, 2, etc., respectively. That is, the most significant byte is shifted from the least significant byte by a distance of 8 bytes in the byte address resolution. In a nonaligned data access, this row offset may be manipulated by the structure of the memory array 20, as shown in FIG. 3. Specifically, the fact that every row has its own dedicated row decoder 22 may be used to manipulate the row addresses of each byte-bank of the memory array and complete the nonaligned data access, as is now explained.

Figure 7:
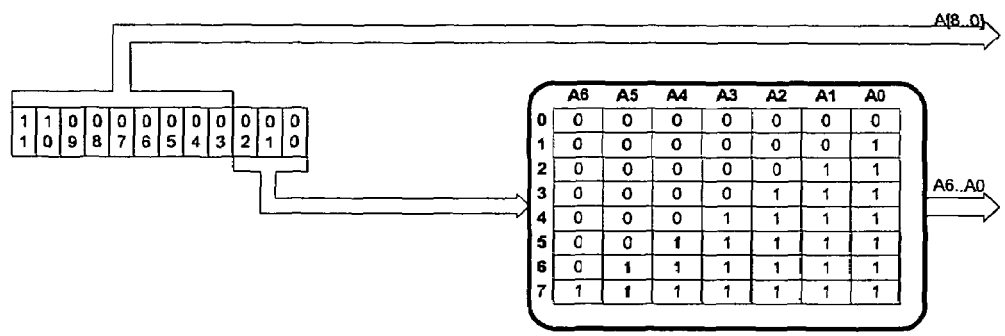
FIG. 7 is a simplified block diagram of an address conversion operator, in accordance with an embodiment of the present invention.

Reference is now made to FIG. 7, which illustrates address conversion operator functionality for the 4 KB memory partition, in accordance with an embodiment of the present invention.

In general, for addressing 4 KB, 12 address bits are needed ($2^{12}$=4096). Among 12 bits of the non-aligned address, the 9-bit component for the aligned access may be extracted from the most significant bits of this address. This component can be used for simultaneous addressing of all byte-banks.

When an unaligned memory access takes place, the 64-bit data word location can be started anywhere in the byte-banks 1 to 7. The 64-bit data word location is defined by the location of its least significant byte and depends on the contents of the three least significant bits of the original 12-bit address. As mentioned hereinabove, a distance of 8 bytes separates the least significant byte of the 64-bit data word from the most significant byte in the byte address resolution. Thus, for the most significant byte or bytes of the unaligned 64-bit data word, the selected memory row is shifted downwards by one row with respect to the memory rows for the least significant byte or bytes in the byte-banks. Therefore, each byte-bank needs a one-bit row offset depending on the starting location of the unaligned 64-bit data word. Such one-bit row offsets may be generated by the address conversion operator shown in FIG. 7 for each byte-bank numbered from 0 to 6 in accordance with all 8 combinations of three least significant buts of the memory partition 12-bit address. No row address offset is required for the byte-bank 7, because it contains the most significant byte of the 64-bit data word only in the case of an aligned access.

Figure 8:
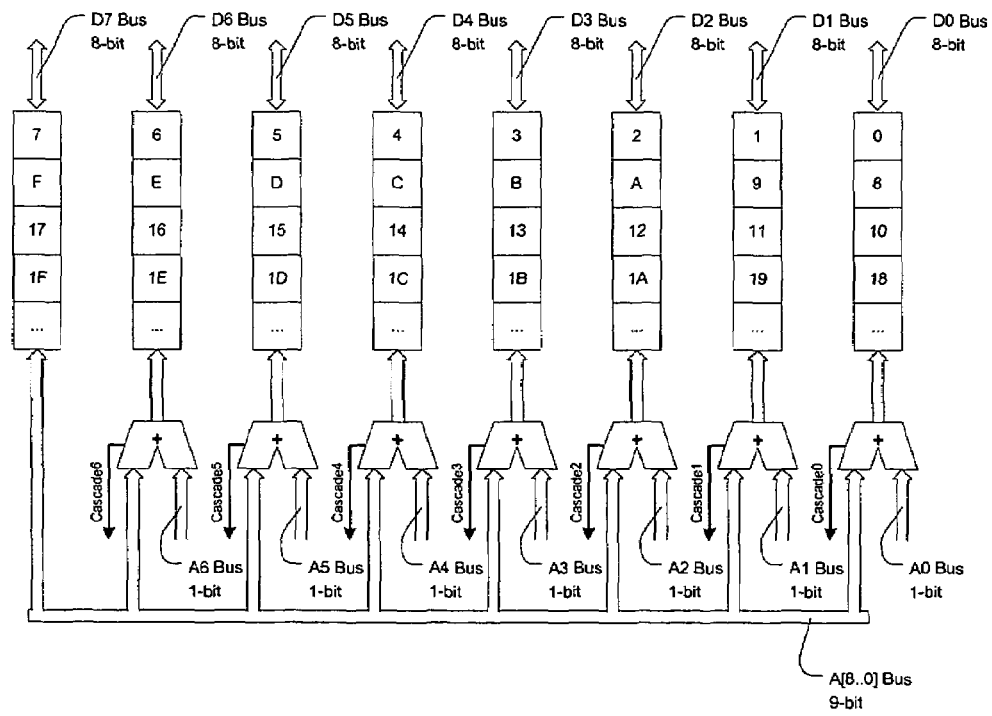
FIG. 8 is a simplified block diagram of memory partition internal interleaving, such as a 4 KB memory partition internal interleaving, in accordance with an embodiment of the present invention.

Reference is now made to FIG. 8, which illustrates the internal structure of a 4 KB memory partition with unaligned 64-bit access (based on the non-limiting example of FIG. 4), in accordance with an embodiment of the present invention.

FIG. 8 adds to the architecture shown in FIG. 4 the addition of an adder 36 and a one-bit offset address bus 38. All 64 bits from all the byte-banks 30 may be addressed in a single memory transaction. Each byte-bank 30 may have its own one-bit offset address bus 38. In an unaligned memory access, the data words may be rotated (shifted) in accordance with the appropriate row of the operator functions of FIG. 5 (write) or FIG. 6 (read) for each byte-bank 30, resulting in a one-bit shift, as described above. The adder 36 adds the 9-bit word address and the one-bit offset and outputs a 9-bit result to the common 9-bit address bus 34. The common 9-bit address bus 34 may then be used to correctly address each byte-bank 30. (The cascade output of FIG. 8 is generated by the appropriate adder 36 when the byte-bank address wraps the boundary of 0x1FF.) Thus the architecture of FIG. 8 provides correct organization of the random access memories 20 for nonaligned access, such as with a byte resolution.

It will be appreciated by persons skilled in the art that the present invention is not limited by what has been particularly shown and described hereinabove. Rather the scope of the present invention includes both combinations and sub-combinations of the features described hereinabove as well as modifications and variations thereof which would occur to a person of skill in the art upon reading the foregoing description and which are not in the prior art.

What is claimed is:

1. Memory apparatus comprising:
   a byte-bank organized in N rows and 8 columns, having a capacity of $\log_2(N)$ bytes;
   a $\log_2(N)$ bit address bus operative to address said byte-bank;
   an address offset bus operative to generate address offsets to bits of said byte-bank with an address conversion operator; and
   an adder in operative communication with said address offset bus and said $\log_2(N)$ bit address bus, said adder operative to add addresses of said byte-bank with the address offset generated by said address conversion operator and output a result to said $\log_2(N)$ bit address.

2. The memory apparatus according to claim 1, wherein said address offsets comprise one-bit address offsets.

3. The memory apparatus according to claim 1, further comprising a random access memory array comprising a plurality of said byte-banks.

4. The memory apparatus according to claim 3, wherein for each byte-bank, said address conversion operator is operative to convert an unaligned address on a byte resolution into a $\log_2(N)$ address on a data word resolution.

5. The memory apparatus according to claim 4, wherein said address offsets comprise one-bit address offsets.

6. The memory apparatus according to claim 1, wherein said address offset comprises shifting the most significant byte from the least significant byte by a distance of 8 bytes.

7. A method comprising:
   providing a random access memory array comprising a plurality of said byte-banks, wherein each byte-bank is organized in N rows and 8 columns, each byte-bank having a capacity of $\log_2(N)$ bytes;
   providing a $\log_2(N)$ bit address bus operative to address said byte-bank;
   generating address offsets to bits of said byte-bank with an address conversion operator; and
   adding addresses of said byte-bank with the generated address offset and outputting a result to said $\log_2(N)$ bit address.

8. The method according to claim 7, wherein generating the address offsets comprises generating one-bit address offsets.

9. The method according to claim 7, further comprising, for each byte-bank, converting an unaligned address on a byte resolution into a $\log_2(N)$ address on a data word resolution.

10. The method according to claim 7, wherein generating the address offsets comprises shifting the most significant byte from the least significant byte by a distance of 8 bytes.

11. The method according to claim 7, further comprising performing an unaligned memory access to said byte-banks.

12. The method according to claim 11, wherein the unaligned memory access comprises transforming a data word before a memory write operation and compensating for the data word rotation with the address offsets.

13. The method according to claim 11, wherein the unaligned memory access comprises transforming a data word before a memory read operation and compensating for the data word rotation with the address offsets.

* * * * *